United States Patent [19]

Murakami et al.

[11] 4,322,780
[45] Mar. 30, 1982

[54] ILLUMINATION MECHANISM

[75] Inventors: Yoshiaki Murakami; Akira Ohmori; Seishichi Ohhara, all of Toda, Japan

[73] Assignee: Clarion Co., Ltd., Tokyo, Japan

[21] Appl. No.: 119,236

[22] Filed: Feb. 6, 1980

[30] Foreign Application Priority Data

Feb. 16, 1979 [JP] Japan ............................ 54/17662[U]

[51] Int. Cl.³ ............................................ H04M 1/22
[52] U.S. Cl. ........................................ 362/31; 362/86; 360/137
[58] Field of Search ............... 362/23, 26, 27, 29, 362/31, 32, 85, 86, 87, 88, 330, 353, 367; 40/541, 564; 360/137; 116/256, 257, 263

[56] References Cited

U.S. PATENT DOCUMENTS

| | | | |
|---|---|---|---|
| 3,513,805 | 5/1970 | Sizer | 116/263 |
| 3,761,704 | 9/1973 | Takeichi et al. | 116/263 |
| 3,981,265 | 9/1976 | Gilbert | 116/263 |
| 4,218,775 | 8/1980 | Cox et al. | 116/263 |

Primary Examiner—L. T. Hix
Assistant Examiner—Alan Mathews
Attorney, Agent, or Firm—Blanchard, Flynn, Thiel, Boutell & Tanis

[57] ABSTRACT

An illumination mechanism for an escutcheon portion of a car sound device such as a car radio, car stereo, etc. The illumination mechanism comprises a light-transmissible plate provided at the front of the escutcheon portion and an illuminating lamp or lamps provided behind the light-transmissible plate. A cassette or cartridge receiving opening is formed in the light-transmissible plate and operating members for the sound device are provided on the plate.

7 Claims, 5 Drawing Figures

ILLUMINATION MECHANISM

BACKGROUND OF THE INVENTION

1. Field of the Invention

This invention relates to an illumination mechanism for an escutcheon of a car sound device such as a car radio or a car stereo.

2. Description of the Prior Art

Heretofore, there has been proposed no special illumination mechanism for illuminating all over an escutcheon panel of a car radio or a car stereo. Instead, it has been elaborated for indication dials or letters to be seen as relieved against the escutcheon panel. However, when the car radio or car stereo is operated at night or in the dark, it is difficult to locate operating knobs or switches or a cassette or cartridge inserting opening and it takes a time to operate switches or control volume etc. or to load a cassette or cartridge. In addition, there is a large possibility of misoperation.

To solve such a problem involved in the conventional illumination mechanism for a car sound device, a mechanism for illuminating an entrance portion of the cassette or cartridge receiving opening by using an additional pilot lamp has been proposed. This mechanism, however, requires the provision, inside of or above the opening, of an extra lamp for illumination of the opening and requires an extra step of manufacturing. In addition, the lamp is subject to a shock due to loading and unloading of the cassette or cartridge and is liable to suffer from troubles due to burning out of the lamp. Furthermore, a lamp provided outside of the opening would mar the appearance of the device and a lamp provided inside of the opening would require a troublesome fitting operation, increase the size of the device or obstruct the loading of the cassette or cartridge.

OBJECT OF THE INVENTION

It is therefore an object of the present invention to provide an illumination mechanism for an escutcheon capable of obviating the defect of the conventional mechanism as mentioned above, which can clearly show the positions and contours of the operating members and the cassette or cartridge receiving opening to allow apparent perception and easy operation of the operating members at night or in the dark.

SUMMARY OF THE INVENTION

In accordance with the present invention, there is provided an illumination mechanism for an escutcheon portion of a car sound device, such as a car radio or a car stereo, having a cassette or cartridge receiving portion and operating members at the front of the escutcheon, which comprises a light-transmissible plate fitted at a forward end portion of the escutcheon portion and an illuminating lamp or lamps provided behind said light-transmissible plate, said cassette or cartridge receiving portion being formed in said light-transmissible plate and said operating members being provided on said plate.

DESCRIPTION OF THE PREFERRED EMBODIMENT

Figure 1:
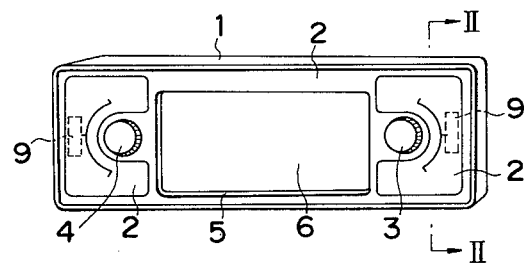
FIG. 1 is a perspective view of one form of an illumination mechanism for an escutcheon of a car sound device in accordance with the present invention.

The invention will now be described, in detail, referring to the drawings. In an illustrated embodiment, the invention is applied to an escutcheon of a car stereo. Numeral 1 designates an escutcheon portion. A trim plate 2 is fitted in the front of the escutcheon 1. The trim plate 2 is made of a material having a high light-transmissivity. The plate 2 may be made of a colored light-transmissible material. By contrast, operating knobs 3 and 4 are made of a material such as a synthetic resin which is lower in light-transmissivity than the trim plate 2 and is arranged in front of the trim plate 2. The trim plate 2 has a cassette or cartridge receiving opening 5 formed therein and a dust cover 6 made, for example, of an aluminum plate, is adapted to normally close the opening and to swing up when a cassette or cartridge is loaded.

Figure 2:
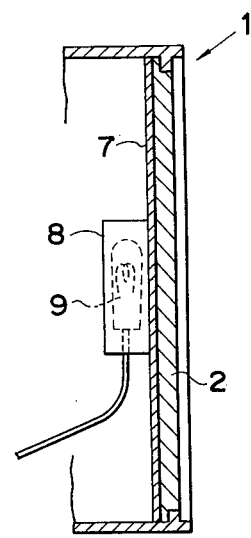
FIG. 2 is a sectional view taken along line II—II in FIG. 1.

Numeral 7 (FIG. 2) designates a back plate provided inside the trim plate 2. The back plate 7 has lamp holders 8 at opposite ends thereof. Pilot lamps 9 are fitted in the lamp holders respectively. The lamps 9 are provided to illuminate the trim plate 2 and when the lamps 9 are lit, light is introduced from the opposite ends of the plate to light up the whole face of the trim plate 2. The pilot lamps 9 are connected to a suitable power source, for example, to a lighting switch of a car so as to light the lamps 9 whenever the switch is closed. Two lamps 9 are not always necessitated but one lamp suffices in case the device is small.

As mentioned above, in accordance with the present invention wherein the trim plate is made of a material having a high light-transmissivity and the operating knobs and the cassette or cartridge inserting portion made of a material lower in light-transmissivity than the trim plate are provided in front of the trim plate, a sharp contrast of light and shade is produced between the trim plate and the operating knobs and the cassette or cartridge inserting portion provided in front thereof when the lamp or lamps behind the trim plate are lit at night or in the dark. Stated more illustratively, areas except the areas corresponding to the operating knobs and the cassette or cartridge inserting opening are lit up by the lamps, while the operating knobs and cassette or cartridge inserting opening are in the shade. Thus the positions and contours of the knobs and opening can be perceived apparently. Thus, the operation can be performed easily and accurately. Especially, if the trim plate is made of a colored light-transmissible material and the operating knobs and the cassette or cartridge inserting portions provided in front of the trim plate are made of a material, such as a metal, which hardly transmits light rays, the contrast between light and shade is more clear and the knobs and the cassette or cartridge inserting portion can be perceived apparently even at night. Thus, possible misoperation or fumbling due to the darkness can be prevented.

Figure 3:
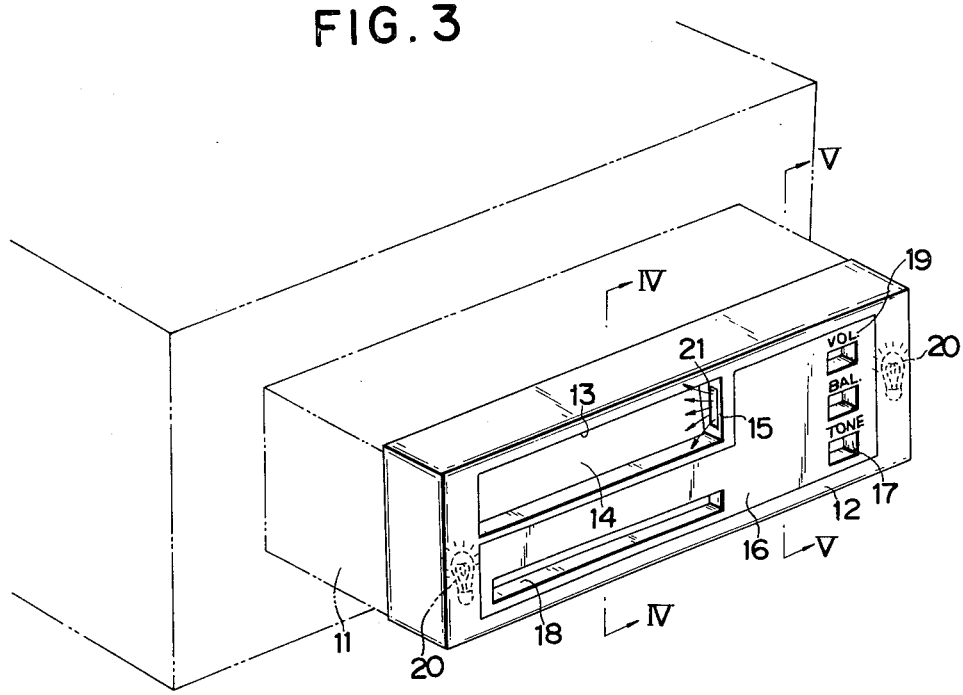
FIG. 3 is a perspective view of another form of an illumination mechanism for an escutcheon of a car sound device in accordance with the present invention.
Figure 4:
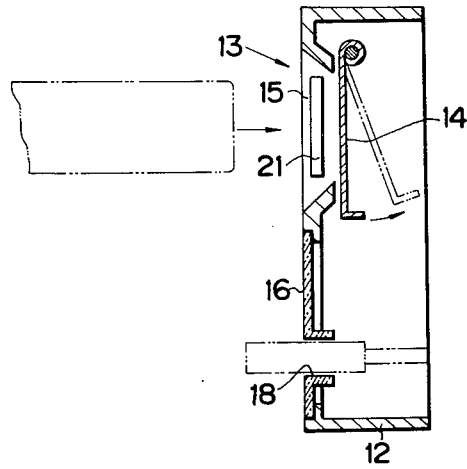
FIG. 4 is a sectional view taken along line IV—IV in FIG. 3.
Figure 5:
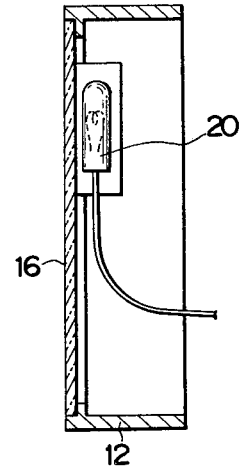
FIG. 5 is a sectional view taken along line V—V in FIG. 3.

FIGS. 3 to 5 illustrate another embodiment of the present invention. In this embodiment, a light introducing opening is formed on a trim member provided around a cassette or cartridge receiving opening and light rays from a lamp or lamps for illuminating indication letters or marks on a sound device, i.e. letters or marks for a volume control knob, a balancer, a loudness control knob, etc., are partially introduced through the light introducing opening to illuminate a front face of a dust cover provided at the cassette or cartridge receiving opening. In FIGS. 3 and 5, numeral 11 designates a body of a car sound device having a panel portion 12 at the front of the body 1. An opening 13 for receiving a cartridge or cassette is formed on the panel portion 12 and is openably shut by a dust cover 14 made of an aluminum plate etc. 15 is a trim member disposed around the cassette or cartridge receiving opening 13. 16 is a light-transmissible plate disposed in the front of the panel portion 12. The light-transmissible plate is made, for example, of an acrylic resin and formed with openings 17 and 18 for fitting operating knobs and pushbuttons therein. Indications 19 for operation thereof are provided on the plate above the respective openings and are adapted to be illuminated by an illuminating lamp or lamps 20 disposed behind the panel. The lamp or lamps 20 are interlocked with a lighting switch of a car and adapted to be lit when the switch is turned on. The lamp or lamps may be covered by a color cap or caps, respectively. A light introducing opening 21 is formed on a side face of the trim member 15 disposed around the cassette or cartridge receiving opening 13. Through the opening 21, light of the lamp or lamps 20 disposed on the side of the opening is introduced onto the face of the dust cover 14 to illuminate the same.

The light introducing opening 21 may be formed by making a portion of the trim member 15 of a material having a high light-transmissivity, or alternatively it may be formed by cutting the trim plate to make a window when the plate is made of a material having a low light-permissivity, such as a metal or plastic plate.

As mentioned above, in accordance with the present invention, wherein the opening for introducing illuminating light therethrough is formed on a side face of the trim member disposed around the cassette or cartridge receiving opening and the front face of the dust cover provided at the front of the receiving opening is adapted to be illuminated by utilizing the lamp provided for illuminating the indication letters or marks, there is no need to provide an additional lamp or lamps for illuminating the cassette or cartridge receiving opening. Furthermore, since the lamp for illuminating the indication is utilized for illumination of the receiving opening, the number of manufacturing steps can be reduced and the cost of manufacturing can also be reduced. In addition, the invention facilitates maintenance such as check and replacement of the lamps and it provides a device of compact structure and good appearance. The structure of the present mechanism will by no means obstruct the loading and unloading operations of the cassette or cartridge.

In case the lamps are covered by the colored caps to illuminate the dust cover by colored light like an instrument cluster, the front face of the dust cover can be relieved more clearly, providing an aesthetic effect.

We claim:

1. In an automotive stereo device having an escutcheon portion at the front thereof, said escutcheon portion having wall means defining an opening for receiving a tape cassette or cartridge and having at least one operating member for controlling operation of the stereo device, an illumination mechanism comprising a light-transmissive plate made of a material having a high light transmissivity, said plate being mounted at the forward end of said escutcheon portion and having a cutout portion provided therein, at least one illuminating lamp provided behind said plate for illuminating said plate, said operating member being supported in front of said plate and said wall means being located in said cutout portion of said plate, said wall means being made of a material having a lower light transmissivity than that of said plate so that when said lamp is lit, said wall means will be of lower brightness than said plate.

2. An automotive stereo device as claimed in claim 1 wherein said escutcheon portion has a rectangular front wall, said plate forms a portion of said front wall and extends substantially the width of said front wall, said plate having an end portion extending partway across the width of said front wall and extending substantially the height of said front wall and the remainder of said plate being of reduced height and extending along the lower portion of said front wall, the zone above said remainder of said plate defining said cutout portion.

3. An automotive stereo device as claimed in claim 1, wherein said operating member is made of a material having a lower light transmissivity than that of said plate.

4. An automotive stereo device as claimed in claim 1, wherein said plate is made of a colored light-transmissive material.

5. An automotive stereo device as claimed in claim 1, which further comprises a back plate provided behind said light-transmissive plate and a lamp holder provided at an end of said back plate for holding said illuminating lamp.

6. An automotive stereo device as claimed in claim 1, including an openable dust cover for closing said opening, said wall means comprising a trim member having a light introducing opening in a side face thereof for introducing light from said illuminating lamp onto the front of said dust cover to illuminate said cover.

7. An automotive stereo device as claimed in claim 6, which further comprises a color cap covering said illuminating lamp.

* * * * *